United States Patent [19]
Nakamura

[11] Patent Number: 6,079,039
[45] Date of Patent: Jun. 20, 2000

[54] TEST CIRCUIT AND TEST METHOD FOR TESTING SEMICONDUCTOR CHIP

[75] Inventor: Yoshiyuki Nakamura, Tokyo, Japan

[73] Assignee: NEC Corporation, Tokyo, Japan

[21] Appl. No.: 08/997,720

[22] Filed: Dec. 23, 1997

[30] Foreign Application Priority Data

Dec. 25, 1996 [JP] Japan .................... 8-344803

[51] Int. Cl.[7] .................................. G01R 31/28
[52] U.S. Cl. ............... 714/726; 714/727; 714/724; 714/729
[58] Field of Search ..................... 714/726, 727, 714/724, 729, 731, 733, 734, 744; 324/76.1, 158.1

[56] References Cited

U.S. PATENT DOCUMENTS

| 5,530,706 | 6/1996 | Josephson et al. | 714/727 |
| 5,663,966 | 9/1997 | Day et al. | 714/731 |
| 5,673,273 | 9/1997 | Almy | 714/724 |
| 5,701,308 | 12/1997 | Attaway et al. | 714/726 |
| 5,748,645 | 5/1998 | Hunter et al. | 714/726 |

FOREIGN PATENT DOCUMENTS

| 5-72273 | 3/1993 | Japan . |
| 5-142307 | 6/1993 | Japan . |
| 7-63821 | 3/1995 | Japan . |
| 7-244127 | 9/1995 | Japan . |
| 7-270494 | 10/1995 | Japan . |

OTHER PUBLICATIONS

IEEE, Standard 1149.1, 1990, p. 5–1 and Appendix A–1–A–2.

*Primary Examiner*—Hoa T. Nguyen
*Attorney, Agent, or Firm*—Sughrue, Mion, Zinn, Macpeak & Seas, PLLC

[57] ABSTRACT

In a test circuit, both a boundary scan test and an internal scan test are carried out. Such a test circuit has at least one test terminal for the boundary scan test. In this event, a test clock signal is given to the test terminal. Further, the test circuit has a first clock generating circuit and a second clock generating circuit. The first clock generating circuit generates a first clock signal for the boundary scan test based upon the test clock signal. On the other hand, the second clock generating circuit generates a second clock signal for the internal scan test based upon the test clock signal. Thus, the first clock signal for the boundary scan test and the second clock signal for the internal scan test are made on the basis of the same clock signal (the test clock signal). As a result, the internal scan test can be performed by the same sequence with the boundary scan test without an increment of test terminals.

10 Claims, 4 Drawing Sheets

TEST CIRCUIT AND TEST METHOD FOR TESTING SEMICONDUCTOR CHIP

BACKGROUND OF THE INVENTION

This invention relates to a test circuit and a test method for testing semiconductor chips which are arranged on a board and are electrically connected to each other.

Conventionally, suggestion has been made about a method (thereinafter, referred to as an internal scan) for forming an internal scan path inside a semiconductor chip to test whether or not logic circuits in the semiconductor chip normally operate. The internal scan is mainly used to test the respective semiconductor chips.

On the other hand, another suggestion has been made about a test method (thereinafter, referred to as a boundary scan) due to a boundary scan for testing whether or not the semiconductor chips are normally connected to each other on the board. The boundary scan is standardized by IEEE 1149.1. In this case, TDI, TDO, TCK, TMS and TRST terminals must be provided for the boundary scan.

Recently, it has been required to check normality of the individual chips in addition to the connection relation between the semiconductor chips which are arranged on the board and are electrically connected to each other. To comply with the requirement, it is necessary to perform the internal scan as well as the boundary scan on the condition that the semiconductor chips are arranged on the board.

A semiconductor integrated circuit in which the boundary scan and the internal scan are performed together is disclosed in Japanese Unexamined Patent Publication No. H5-142307 (reference 1), Japanese Unexamined Patent Publication No. H7-63821 (reference 2) and Japanese Unexamined Patent Publication No. H5-72273 (reference 3). The semiconductor integrated circuit disclosed in the reference 1 has logic circuits, a test circuit for performing the boundary scan test, and a specific cell which is used during the boundary scan. With this structure, the specific cell is used as a control signal supply path for the logic circuits by an instruction.

In this event, the above specific cell has a system clock terminal, and clock pulses are supplied for the logic circuits via the system clock terminal during the internal scan. However, although the boundary scan is conducted independent from the internal scan with such a structure, the system clock terminal which is used only during the internal scan is additionally necessary. Therefore, the internal scan can not be performed by the use of only the terminals standardized by the above IEEE 1149.1, namely TDI, TDO, TCK, TMS and TRST terminals. Consequently, the number of the terminals is increased in the reference 1. Further, an internal scan resistor for the internal scan and a boundary scan resistor for the boundary scan can not be operated at the same time in the reference 1. This means that the internal scan must be performed after an instruction for shifting the internal scan resistor is set and further the boundary scan must be conducted after an instruction for shifting the boundary scan resistor is set again. Therefore, a long time is necessary to perform the internal scan and the boundary scan.

On the other hand, the reference 2 discloses a test circuit in which at least a part of the boundary scan resistor is used as a parallel/serial converter or a serial/parallel converter during the internal scan and thereby, a scan data is inputted and outputted via the converter. However, the terminal which is exclusively used for the internal scan is necessary like the reference 1. Consequently, the terminal number is also inevitably increased in the reference 2.

In the above references 1 and 2, an additional circuit for the internal scan is required when the internal scan is carried out on the board.

In addition, the reference 3 discloses an integrated circuit device in which the boundary scan is performed with a sequence specified by IEEE 1149.1 and further, the internal scan is also conducted. The internal scan is realized by operating a scan path and a by-pass scan path consisting of a scan path select circuit in accordance with the sequence of the boundary scan specified by the above IEEE 1149.1.

However, such a structure is complicated and therefore, it is difficult to apply to a general circuit, since it is necessary to provide a specific circuit such as the by-pass scan path in the integrated circuit device.

SUMMARY OF THE INVENTION

It is therefore an object of this invention to provide a test circuit which is capable of performing both a boundary scan and an internal scan in parallel without an increment of terminals for the test and thereby shortening a test duration.

It is an another object of this invention to provide a test circuit which is capable of performing an internal scan without a specific circuit on the condition that a semiconductor chip such as an LSI is arranged on a board.

It is still another object of this invention to provide a test method which is capable of performing both a boundary scan and an internal scan in accordance with a sequence specified by IEEEE 1149.1.

In a test circuit according to this invention, both a boundary scan test and an internal scan test are carried out. Such a test circuit has at least one test terminal for the boundary scan test. In this event, a test clock signal is given to the test terminal. Further, the test circuit has a first clock generating means and a second clock generating means. The first clock generating means generates a first clock signal for the boundary scan test based upon the test clock signal. On the other hand, the second clock generating means generates a second clock signal for the internal scan test based upon the test clock signal.

Thus, the first clock signal for the boundary scan test and the second clock signal for the internal scan test are made on the basis of the same clock signal (the test clock signal). As a result, the internal scan test can be performed by the same sequence with the boundary scan test without an increment of test terminals.

DESCRIPTION OF THE PREFERRED EMBODIMENT

Figure 1:
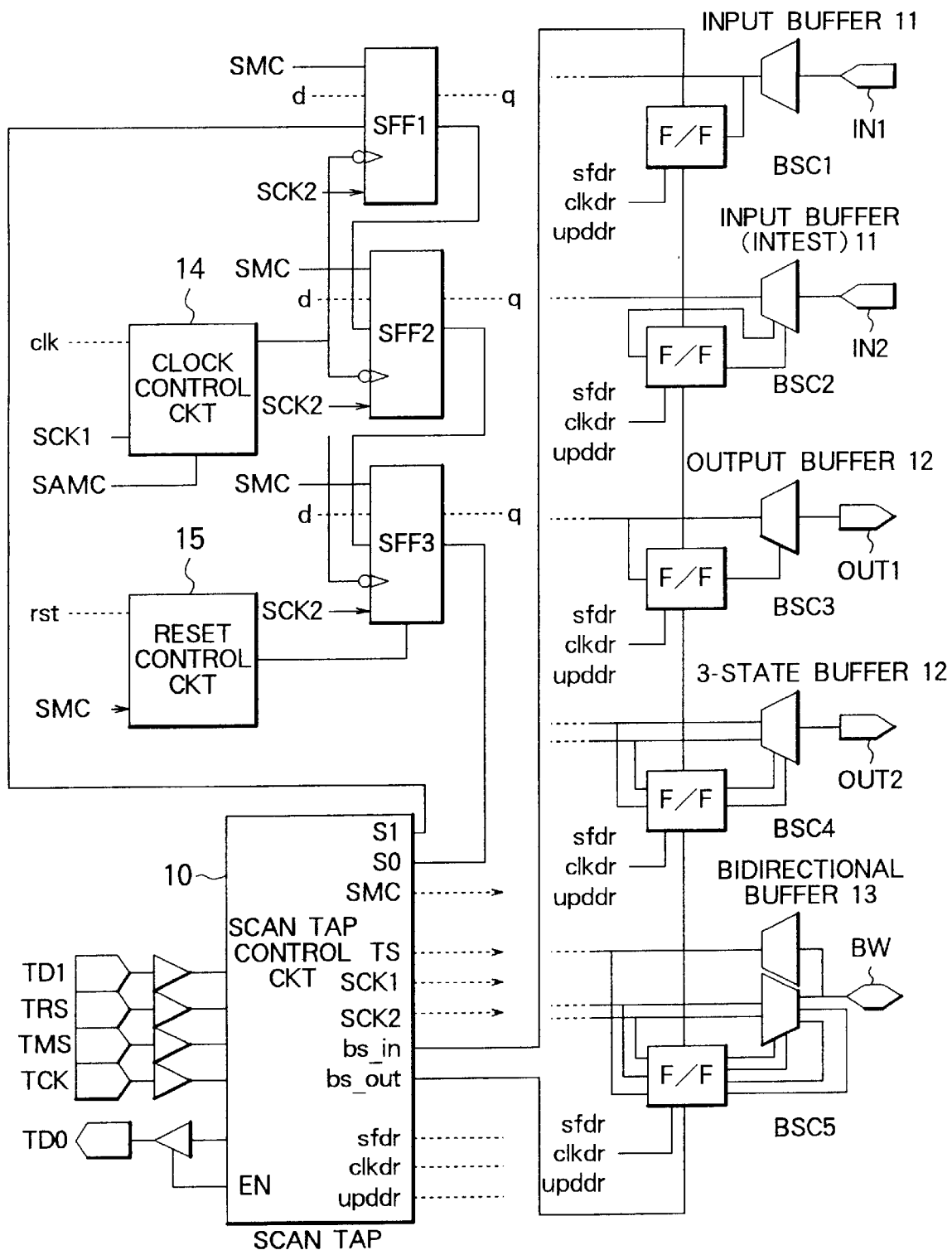
FIG. 1 is a schematic block diagram showing a test circuit according to an embodiment of this invention.

Referring to FIG. 1, a test circuit includes a test control circuit, namely a scan tap control circuit 10 having TDI, TRS, TMS, TCK and TDO terminals necessary for boundary scan of IEEE 1149.1. In this event, signals are given to the TDI, TRS, TMS and TCK terminals in accordance with a boundary scan sequence specified by IEEE 1149.1. That is, the TDI terminal is a test exclusive input terminal which is given a variety of test instructions and test data signals, while the TDO is a test exclusive output terminal from which the test data signals are outputted. Further, the TMS terminal is a test mode selection terminal which is given a test mode signal, while a test exclusive clocks are given to the TCK terminal. In addition, a test reset signal is given to the TRS terminal.

Moreover, the scan tap control circuit 10 internally generates internal signals bs-in, bs-out, sfdr, clkdr, and upddr which are specified by the boundary scan sequence. Among these internal signals, the bs-in supplies a boundary scan input signal, the bs-out supplies a boundary scan output signal, the sfdr supplies a data register shift signal, the clkdr supplies a data register clock signal, and the udddr supplies a data register update signal, respectively.

In addition, the illustrated scan tap control circuit 10 can supply internal scan test signals SI, SO, SMC, TS, SCK1 and SCK2 in accordance with a sequence which is disclosed, for example, in Japanese Unexamined Patent Publication No. H6-160477 without increasing the above boundary scan test terminals TDI, TRS, TDO, TMS and TCK. In this case, the SI is an internal scan input signal, the SO is an internal scan output signal, the SMC is an internal scan mode signal and the TS is an internal test mode signal. The SCK1 and SCK2 are first and second internal test clock signals which have phases different from each other. The first and second internal test clock signals SCK1 and SCK2 enable to prevent an error operation due to a clock skew during a shift operation of the internal scan, and enables to test a logic integrated circuit using multi-phase clocks.

The scan tap control circuit 10 may be individually arranged in each of semiconductor chips which are disposed on a mounting substrate (namely, a board). Alternatively, the scan tap control circuit 10 may be provided in a specific chip in the semiconductor chips which are disposed on the board, or may be arranged separate from the semiconductor chip. At any rate, the illustrated scan tap control circuit 10 can perform not only the boundary scan but also the internal scan for the semiconductor chips on the board without an increment of the terminal number.

In FIG. 1, boundary scan cells BSC1 to BSC5 which are connected in series during the boundary scan are provided in the semiconductor chip. Each of the boundary cells BSC1 to BSC5 has a flip-flop circuit (F/F) and a buffer, and may be referred to as a boundary scan register. The boundary scan cells BSC1 and BSC2 are connected to input ports IN1 and IN2. Therefore, each of the boundary scan cells BSC1 and BSC2 has an input buffer 11. Further, the boundary scan cells BSC3 and BSC4 are connected to output ports OUT1 and OUT 2. Therefore, each of the boundary scan cells BSC3 and BSC4 has an output buffer 12. In this example, the boundary scan cell BSC4 has a 3-state buffer 12. In addition, the boundary scan cell BSC5 is connected to a bidirectional buffer 13. Thus, five boundary scan cells BSC1 to BSC5 (namely, the boundary scan register) are provided in this example.

The flip-flops F/F constituting each of the boundary scan cells BSC1 to BSC5 are connected in series during the boundary scan. Further, the flip-flops F/F are given from the scan tap control circuit 10 with the boundary scan input signal bs-in and supply the boundary scan output signal bs-out to the scan tap control circuit 10. In addition, each of the flip-flop circuits F/F are given a data register clock signal clkdr, a data register shift signal sfdr and a data register update signal upddr which are supplied during the boundary scan to perform the boundary scan test in accordance with the sequence (mentioned later) specified by IEEE 1149.1.

In this example, the above data register represents the boundary scan cells BSC1 to BSC5 and internal scan flip-flops SFF1 to SFF3 (mentioned later), but may include an ID register (not shown) and the like.

The internal scan flip-flops SFF1 to SFF3 (namely, three internal scan registers) are provided in the illustrated semiconductor chip and are connected to SI terminal and SO terminal of the scan tap control circuit 10. The internal scan flip-flop SFF1 is given the internal scan mode signal SMC and retains the internal scan input signal SI in accordance with the second internal test clock signal SCK2. In this event, the internal scan flip-flop SFF1 receives a data input signal d and supplies an output signal q on the condition that no scan is carried out.

The internal scan flip-flop SFF2 is given the internal scan mode signal SMC and performs the internal scan operation in accordance with the second internal test clock signal SCK2. A clock control circuit 14 is connected to an input side of the internal scan flip-flop SFF2. The clock control circuit 14 is given a first clock clk and the first internal test clock signal SCK1 in addition to the internal scan mode signal SMC and supplies the clock signals. In this case, the internal scan flip-flop SFF2 receives a data input signal d and supplies an output signal q in the condition except for the internal scan.

The internal scan flip-flop SFF3 is given the internal scan mode signal SMC and performs the internal scan operation in accordance with the second internal test clock signal SCK2. A reset control circuit 15 is connected to an input side of the internal scan flip-flop SFF3. A second clock rst and the internal scan mode signal SMC are given to the reset control circuit 22. In this event, the reset control circuit 15 supplies the second clock rst to the internal scan flip-flop SFF3 when the internal scan mode signal SMC is not supplied. Consequently, the internal scan flip-flop SFF3 stores a data input signal d at a timing of the second clock rst and supplies a data output signal q.

With this structure, both the boundary scan and the internal scan can be performed in accordance with the sequence specified by IEEE 1149.1.

Figure 2:
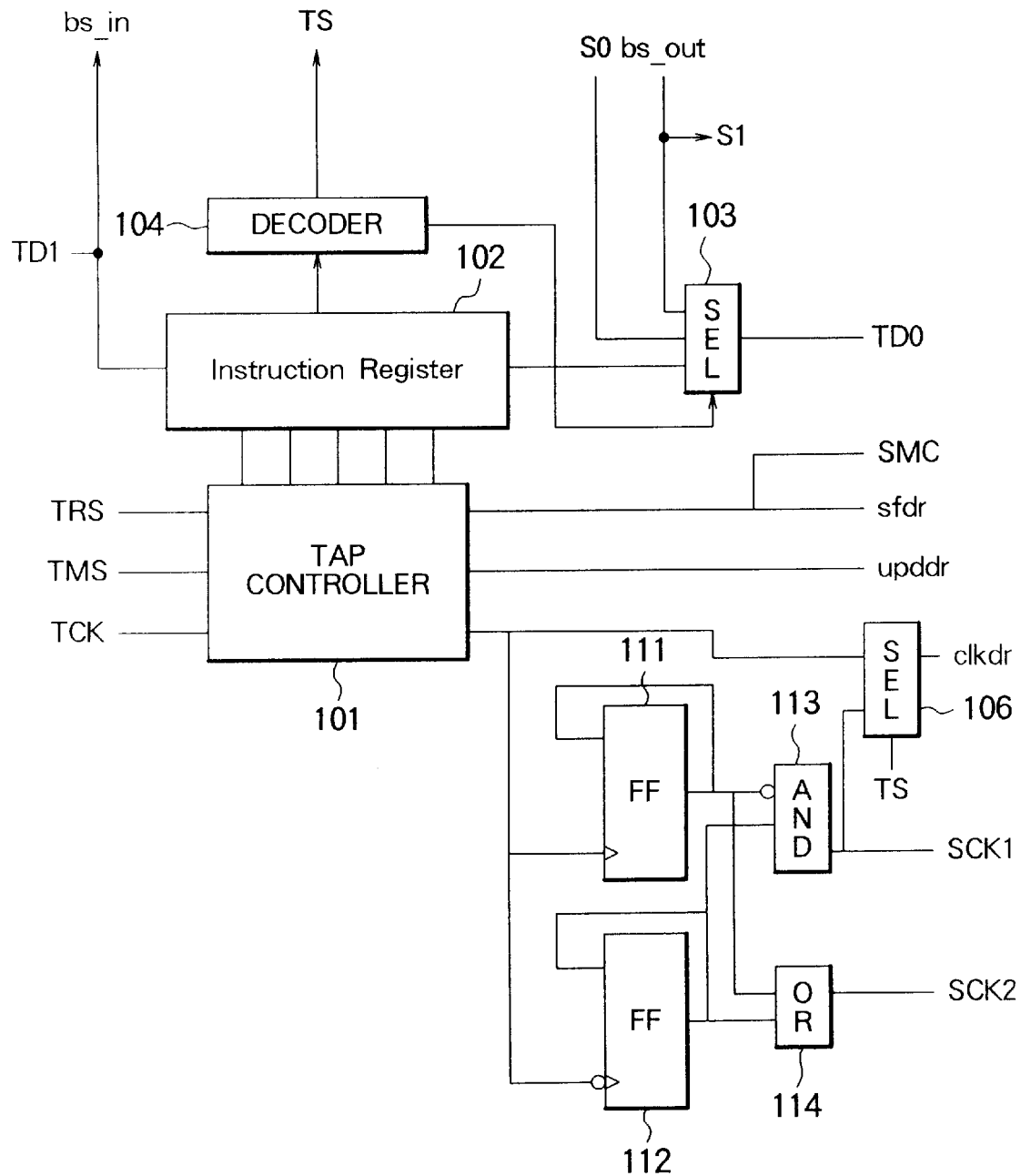
FIG. 2 is a detail block diagram showing a scan tap control circuit illustrated in FIG. 1.

Referring to FIG. 2 together, the scan tap control circuit 10 includes a tap controller 101 and an instruction register 102 which are standardized by IEEE 1149.1. The tap controller 101 is connected to the TRS, TMS and TCK terminals which are illustrated in FIG. 1, while the instruction register 102 is connected to the TDI terminal. The instruction register 102 is connected to the TDO terminal via a third selector (SEL) 103. In this case, the instruction register 102 is connected to a decoder 104. The decoder 104 decodes a specific instruction to supply an internal mode signal TS and supplies a select signal to the third selector 103. Thereby, the third selector 103 selectively supplies either of the internal scan signal SO and the boundary scan output signal bs-out to the test exclusive output terminal TDO in response to the select signal.

Further, the TDI terminal is given the boundary input signal bs-in during the boundary scan. As shown in FIG. 2, the internal scan input signal SI during the internal scan is taken out from a common terminal of the boundary scan output signal bs-out. This means that the internal scan register and the boundary scan register are connected in series to operate at the same time.

The tap controller 101 supplies the data register shift signal sfdr and the data register update signal upddr in accordance with the boundary scan sequence in response to the test reset signal, the test mode select signal and the test exclusive clock which are given from TRS, TMS and TCK terminals. In this event, the tap controller 101 supplies the internal scan mode signal SMC instead of the data register shift signal sfdr during the internal scan. Further, the tap controller 101 supplies clock signals to a fourth selector 106. The fourth selector 106 outputs the clock signals from the tap controller 101 as the data register clock signals clkdr in the condition that the selector 106 does not receive the internal test mode signal TS from the decoder 104. Further, the selector 106 selects the first test clock signals SCK1 and outputs as the data register clock signals clkdr.

In addition, the scan tap control circuit 10 has first and second flip-flops (F/F) 111 and 112 to supply the first and second internal test clock signals SCK1 and SCK2. The first and second F/F 111 and 112 are given the clock signals from the tap controller 101. Output signals of the first and second F/F 111 and 112 are supplied as the first and second internal test clock signals SCKI and SCK2.

More specifically, the output signal of the first F/F 111 which is directly given the clock signals from the tap controller 101 is fed back to an input thereof. Further, the output signal is supplied to a OR circuit 114, and is supplied to an AND circuit 113 in an inhibited form. On the other hand, the output signal of the second F/F 112 which is given the clock signal from the tap controller 101 in an inhibited form is fed back to an input thereof. Further, the output signal is supplied to the AND circuit 113 and the OR circuit 114. The first and second internal test clock signals SCK1 and SCK2 are outputted from the AND circuit 113 and the OR circuit 114, respectively.

Figure 3:
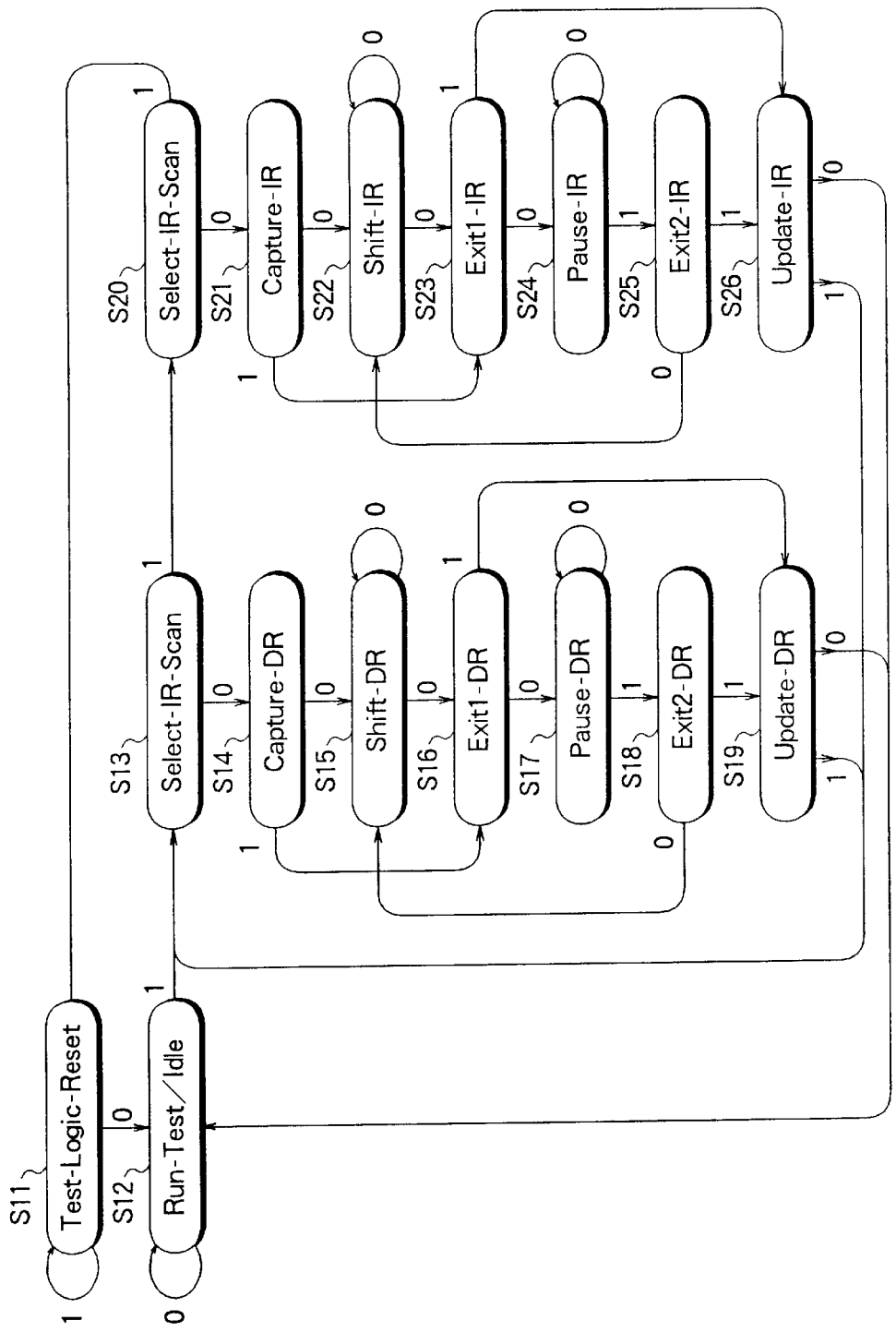
FIG. 3 shows a sequence of a boundary scan test.

Referring to FIG. 3, the sequence of the boundary scan specified by IEEEE 1149.1 is described and is directly applied to the internal scan in the embodiment of this invention.

First, the scan tap control circuit 10 is put into a TEST-LOGIC-RESET state in step S11 when a state of the TRS terminal is changed from a logic "1" to a logic "0". This state continues while the logic "1" is given to the TRS terminal. Under this circumstance, the tap controller 101 resets a test logic and automatically generates an INCODE instruction to be given to the instruction register 102.

When a logic "0" is given to the TMS terminal as the test mode signal in step S11, Run-Test/Idle state appears in step S12, and Select-DR-Scan state of step S13 appears at the next logic "1" to select the above scan of the data register (DR) in accordance with the boundary scan sequence. When a logic "1" is given in the condition that the scan of the data register is selected, a state of Capture-DR of step S14 appears to capture the data register. Next, when a logic "0" is given, a state of Shift-DR of step S15 appears to shift the data register. Subsequently, when a logic "1" is given in step S15, a state of Exit 1-DR of step S16 appears. Thereinafter, when a logic "0" and a logic "1" are given, a state of Update-DR appears via states of Pause-DR and Exit2-DR of steps S17 and S18 to update the data register. Further, when a logic "1" is given in Exit 1-DR of step S16, an update state of the data register of step S19 appears. When a logic "0" is given in step S19, the state returns to step S12, while when a logic "1" is given, the state returns to step S13.

When a logic "1" is given to the TMS terminal as the test mode signal in step S13, a state of Select-IR-Scan of step S20 appears to select the instruction register 102. Thereinafter, a state of Capture-IR of step S21 appears by giving a logic "0" to capture the instruction register 102, and a state of Shift-IR of step S22 appears by giving a logic "0" to shift the content of the instruction register 102 and determine the instruction, like the case of the data register. When logics "1", "0", "1" and "1" are sequentially given in the condition of step S22, states of Exit1-IR, Pause-IR, Exit2-IR and Update-IR appears in step S23, S24, S25 and S26, respectively. A logic "1" is given in the update condition of the instruction register 102 of Update-IR in step S26, the state returns to step S13, while when a logic "0" is given, the state returns to step S12.

Thus, the state of the scan tap control circuit 10 can be controlled by the test mode signal given to the TMS terminal, and thereby the boundary scan can be performed in accordance with the sequence specified by the above IEEE 1149.1. In the scan tap control circuit 10 illustrated in FIGS. 1 and 2, the internal scan can be carried out by directly using the above sequence.

Referring to FIGS. 1 to 3, description will be made about the internal scan which is performed in accordance with the sequence of FIG. 3.

First, when a logic "0", a logic "1", a logic "1" are sequentially given to the test mode select terminal TMS in synchronism with the clock signal of the test clock terminal TCK in the state of Test-Logic-Reset in step S11 illustrated in FIG. 3, the state is transferred to the state of Select-IR-Scan from the state of Test-logic-Reset in step S11 through the state of Run-Test/Idle in step S12 and the state of Select-DR-Scan in step S13. Further, when logics "0" and "0" are given to the TMS terminal, the state is put into the state of Shift-IR in step S22.

When "101" representing the internal scan mode is given to the TDI terminal as the test instruction in step S22, the decoder 104 in the scan tap control circuit 10 is put into the internal scan mode, and the internal test mode signal TS becomes a logic "1". The decoder 104 decodes the above test instruction of the instruction register 102 and supply the internal test mode signal TS. Further, the third selector 103 selects the internal scan output signal SO to supply to the test exclusive output terminal TDO.

Thereafter, the test mode signal is given in synchronism with the test exclusive clock of the TCK terminal. Consequently, the internal scan can be performed in accordance with the sequence described in FIG. 3 by transferring to arbitrary states like the case of the boundary scan. This means that an operation based on IEEE 1149.1 is carried out in the scan tap control circuit 10 in FIG. 2. Further, the scan tap control circuit 10 can also supplies signals TS, SMC, SI, SO, SCK1 and SCK2 necessary for the internal scan.

Next, referring to FIG. 4, description will be made about an operation of the internal scan of the scan tap control circuit 10.

Figure 4:
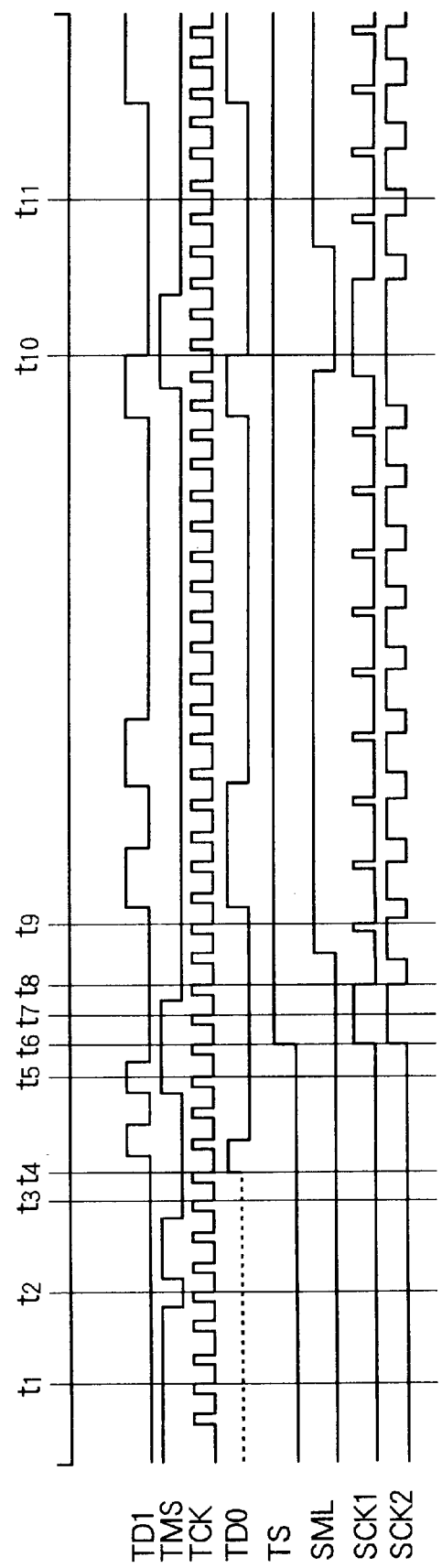
FIG. 4 is a timing chart showing an operation of a test circuit illustrated in FIGS. 1 and 2.

In FIG. 4, test clocks having a desired repeating frequency are given to the TCK terminal. In this event, when the test reset signal is given to the TRS terminal and a logic "1" is given to the TMS terminal as the test mode signal as shown by a timing T1, the state of the scan tap control circuit 10 is put into a reset state, namely the state of the step S11 in FIG. 3. This state continues while the test mode signal of a logic "1" is given to the TMS terminal. When the test mode signal of the TMS terminal becomes a logic "0" in synchronism with the test clock signal as shown by a timing t2, the state is transferred to the step S12. After the timing t2, the illustrated test mode signal keeps the state of a logic "1" between two test clock signals. Consequently, the operation of the scan tap control circuit 10 is transferred from the step S12 to the step S20 through the step S13. The scan tap control circuit 10 is put into the state (Capture-IR) of the step S21 for capturing the instruction register 102, since the test mode signal which is given to the TMS terminal becomes a logic "0" at a timing t3.

After the timing t3, the test mode signal also keeps the state of a logic "0" at a timing t4. Consequently, the operation of the scan tap control circuit 10 is transferred to the step S22 to shift the instruction register 102. Further, where a logic "101" is given to the test exclusive input terminal TDI in synchronism with the test clock signal (TCK) after the timing t4 and it is judged that the given test instruction indicates the internal scan, the scan tap control circuit 10 is put into the internal scan state at a timing t5.

On the other hand, the scan mode signal which is given to the TMS terminal is put into the state of a logic "1" at timings t6 and t7. Consequently, the state returns to the steps S24 and S12. At a timing t6, the internal test mode signal becomes a logic "1" and the first and second internal test clock signals SCK1 and SCK2 are outputted from the scan tap control circuit 10.

As shown in FIG. 4, each of the first and second internal test clock signals SCK1 and SCK2 has a repeating frequency of half of the test clock signal (TCK). Thus, the internal scan can be performed in accordance with the sequence illustrated in FIG. 3 by using the two internal test clock signals SCK1 and SCK2.

In the illustrated example, a first scan shift, namely the scan test is performed between a timing t9 and a timing t10. The scan shift of 8 cycles (16 cycles in the TCK) is performed because eight registers in total are composed of three internal scan flip-flops SFF1 to SFF3 and five boundary scan cells BSC1 to BSC5.

Successively, a first update and capture operation is performed between a timing t10 and t11. Next, a second scan shift (scan test) is performed from a timing t11. Thus, in this example, the state does not return to Run-Test/Idle and further does not go to Shift-IR. Consequently, a test duration can be shortened.

Returning to FIG. 2, the first and second flip-flops (F/F) 111 and 112, the AND circuit 113 and the OR circuit 114 operates circuits for generating the first and second internal test clock signals SCK1 and SCK2. Thus, the internal scan which is similar to the internal scan disclosed in Japanese Unexamined Patent Publication No. H6-160477 can be performed. Further, a waveform specified by IEEE 1149.1 can be formed by generating two internal scan test clock signals SCK1 and SCK2.

What is claimed is:

1. A test circuit for performing a boundary scan test and an internal scan test, comprising:
   at least one test terminal for the boundary scan test which is given a test clock signal;
   first clock generating means for generating a first clock signal for the boundary scan test based upon the test clock signal; and
   second clock generating means for generating a second clock signal for the internal scan test based upon the test clock signal so that the internal scan test is carried out with the same sequence with the boundary scan test by the use of the test terminal.

2. The test circuit claimed in claim 1, further comprising;
   third clock generating means for generating a third clock signal for the internal scan test which has a phase different from that of the second clock signal based upon the test clock signal.

3. A test circuit for performing a boundary scan test and an internal scan test, comprising:
   at least one test terminal for the boundary scan test which is given a test clock signal;
   control means which is connected to the test terminal and which generates a first clock signal for the boundary scan test based upon the test clock signal;
   first clock generating means which is given the first clock signal and which generates a second clock signal for the internal scan test;
   decoding means for decoding a predetermined instruction into an internal scan test mode signal; and
   selecting means which is selectively given the first clock signal and the second clock signal;
   said selecting means selecting the second clock signal for the boundary scan test instead of the first clock signal when the internal scan test mode signal is given.

4. The test circuit claimed in claim 3, further comprising:
   an instruction register which is connected to said control means and which stores the predetermined instruction.

5. The test circuit claimed in claim 3, further comprising:
   second clock generating means which is given the first clock signal and which generates a third clock signal for the internal scan test which has a phase different from that of the second clock signal.

6. A semiconductor chip which is arranged on a board and which a boundary scan test and an internal scan test are performed, comprising:
   at least one test terminal for the boundary scan test which is given a test clock signal;
   a control circuit which is connected to the test terminal and which selectively generates a first clock signal for the boundary scan test and a second clock signal for the internal scan test based upon the test clock signal;
   a boundary scan register which is connected to said control circuit and which is given the first clock signal; and
   an internal scan register which is connected to said control circuit and which is given the second clock signal.

7. The semiconductor chip claimed in claim 6, wherein:
   said boundary scan register is connected to said internal scan register in series and is given the second clock signal instead of the first clock signal when the internal scan test is carried out.

8. The semiconductor chip claimed in claim 6, wherein:
   said boundary scan register is composed of a plurality of first flip-flop circuits each of which is given the first clock signal, and
   said internal scan register is composed of a plurality of second flip-flop circuits each of which is given the second clock signal.

9. A method of testing semiconductor chips having logic circuits which are arranged on a board, comprising the steps of:
   performing a boundary scan test for testing a connection relation between said semiconductor chips by the use of test terminals for the boundary scan test, where the test terminals do not include a system clock terminal; and
   performing an internal scan test for testing the logic circuits in said semiconductor chip;
   wherein the internal scan test is carried out with the same sequence as the boundary scan test using only the test terminals as terminals.

10. The method claimed in claim 9, wherein:
    the internal scan test and the boundary scan test are carried out at the same time.

* * * * *